United States Patent [19]

Sakurai

[11] 4,275,143
[45] Jun. 23, 1981

[54] PHOTOPOLYMER INTAGLIO PRINTING PLATE

[75] Inventor: Kiyomi Sakurai, Osaka, Japan

[73] Assignee: Nippon Paint Co., Ltd., Osaka, Japan

[21] Appl. No.: 175,859

[22] Filed: Aug. 6, 1980

Related U.S. Application Data

[63] Continuation of Ser. No. 1,579, Jan. 8, 1979, abandoned, which is a continuation of Ser. No. 861,008, Dec. 15, 1977, abandoned, which is a continuation-in-part of Ser. No. 721,550, Sep. 8, 1976, abandoned.

[30] Foreign Application Priority Data

Sep. 8, 1975 [JP] Japan ............................... 50-109234

[51] Int. Cl.³ ............................................ G03C 5/00
[52] U.S. Cl. .................................... 430/307; 430/281
[58] Field of Search ................................ 430/307, 281

[56] References Cited

U.S. PATENT DOCUMENTS

| 2,760,863 | 8/1956 | Plambeck | 430/281 |
| 3,093,071 | 6/1963 | Taylor | 430/307 |
| 3,097,096 | 7/1963 | Oster | 430/307 |
| 4,079,159 | 3/1978 | Sand et al. | 430/281 |

Primary Examiner—Jack P. Brammer
Attorney, Agent, or Firm—Wenderoth, Lind & Ponack

[57] ABSTRACT

A photopolymer intaglio printing plate comprising a support member and a photopolymer layer provided thereon, said layer having concave portions of a constant depth as ink cells and the lowermost part of each of the concave portions reaching to the surface of the support member so that the surface of the support member is exposed to air at least as a point at said lowermost part, prepared by subjecting a photosensitive plate comprising the support member and a layer of a photopolymerizable composition provided thereon to exposure through a halftone negative or positive film to such an extent that the photopolymerizable composition at the exposed parts is cured down to the bottom of the photopolymerizable composition layer but the photopolymerizable composition at the non-exposed part having a minimum area remains uncured at the lowermost part corresponding to the center of the said non-exposed part and washing out completely the photopolymerizable composition at the non-exposed parts.

5 Claims, 5 Drawing Figures

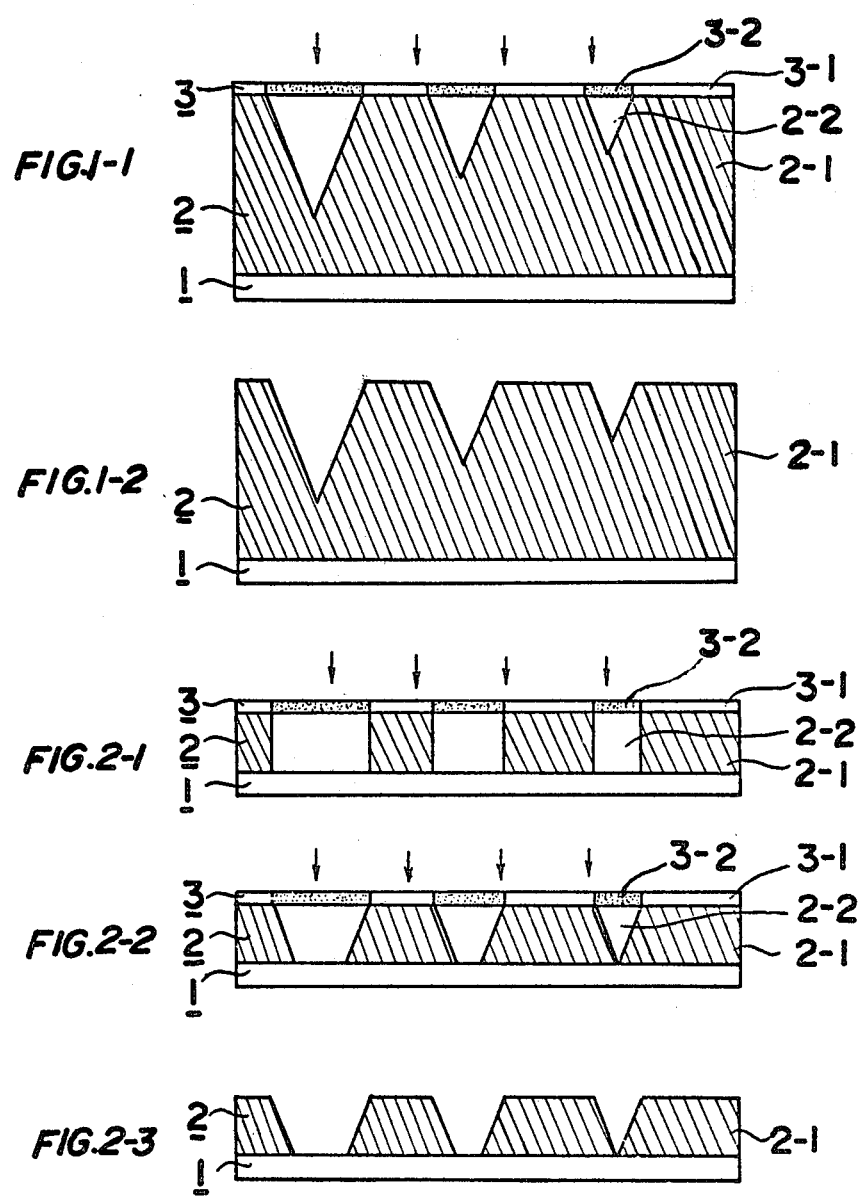

PHOTOPOLYMER INTAGLIO PRINTING PLATE

This is a continuation of application Ser. No. 1,579, filed Jan. 8, 1979, now abandoned which is a continuation of application Ser. No. 861,008, filed Dec. 15, 1977, now abandoned, which in turn is a continuation-in-part of application Ser. No. 721,550, filed Sept. 8, 1976, now abandoned.

The present invention relates to a photopolymer intaglio printing plate. More particularly, it relates to a photopolymer gravure printing plate provided with concave portions or ink cells of a constant depth, and its production.

Gravure printing is practiced in such a manner that firstly an ink is fed onto a plate surface to let it fill in the concave portions thereof, then the ink which adheres to the plate surface is scraped with a doctor blade to cause only the concave portions to retain the ink, and the ink contained in such concave portions is transferred to a material to be printed. In order for such gravure printing plate to reproduce the tone, there are available the following two systems:

[1] A so-called "conventional system" wherein the depths of the concave portions are varied from the highlight part to the shadow part, by which the volume of ink contained therein is adjusted.

[2] A so-called "intaglio halftone gravure system" which has a constant depth of the concave portions but the areas of the concave portions are varied to adjust the volume of ink contained therein.

In these gravure printing plates, either a copper plate or a copper cylinder is etched with ferric chloride solution to form a concave portion. Thus, the conventional method involves a sanitation problem in the working environment and an environment pollution problem caused by disposition of waste etching liquid. In addition, it includes a disadvantage that a skill is required for etching in controlling the depth of the concave portion, and further, there is a vital defect of non-suitability for the printing of a small number of copies because of the extremely high cost of the plate.

A main object of the present invention is to provide a simply producible, low-cost photopolymer intaglio printing plate for which a photopolymerizable composition is utilized to settle the problems as above.

In order to make a concave portion on a photosensitive plate comprising a support member and a layer of a photopolymerizable composition provided thereon, the photopolymerizable composition is cured under exposure to light through a film having a transparent area and an opaque area (for example, a film made by halftone photographing the original material by means of a gravure contact screen, which will be hereinafter referred to as "halftone positive film"), after which the non-exposed part which corresponds to the opaque area of the halftone positive film is washed out with a solvent capable of dissolving the photopolymerizable composition (e.g. water, aqueous alkali, alcohol). In this manner, a halftone intaglio printing plate to express the original gradation by the difference of the spot areas is obtainable.

BRIEF DESCRIPTION OF DRAWINGS

The advantages of the present invention over a conventional method will be hereinafter illustrated with reference to the accompanying drawings wherein:

FIGS. 1-1 and 1-2 show respectively the schematic cross section views of the photosensitive plate at the stages of exposure and of washing according to a conventional method; and FIGS. 2-1, 2-2 and 2-3 show respectively the schematic cross section view of the photosensitive plate at the intermediary and final stages of exposure and at the stage of washing according to the present invention.

In these Figures, the numerals indicate the following parts: 1—a support member (or a support material); 2—a photopolymerizable layer (or a layer of a photopolymerizable composition); 2-1—a cured or hardened part by exposure (or an exposed part); 2-2—a non-cured or non-hardened part on exposure (or a non-exposed part); 3—a positive or negative film; 3-1—a transparent part; 3-2—a non-transparent or opaque part.

DETAILED DESCRIPTION OF INVENTION

In the process of curing, for instance, by the light led through the transparent part of a halftone positive film, the incoming light provides, as shown in FIG. 1-1, a dispersion of light in the photopolymerizable layer or a halation from the lower supporting member, thereby producing a latent image having a pyramidal shape in the photopolymerizable layer. Through the step of washing out this latent image with an adequate solvent and drying, there is obtainable a halftone intaglio printing plate having the shape as shown in FIG. 1-2 wherein the portion of a large exposure area, i.e. the portion corresponding to a small opaque area of the halftone positive film, has a small depth of the concave portion, and the portion corresponding to a large opaque area of the halftone positive film has a large depth of the concave portion. In this manner, the form of the plate made by the combination of the relative sizes of the area and the depth of the concave portions is a form of the plate based on a kind of a gravure plate making method called "two positive method for gravure". In the preparation of a gravure printing plate of such a plate from a photopolymerizable composition, the area of the concave portion can be reproduced at all times at the prescribed rate under control of the halftone positive film in use, but the depth of the concave portion is hardly producible to a fixed level, because the latter, which is variable by the halftone positive film, is subjected to variation by exposure conditions, washing conditions, etc. For example, when the exposure conditions become excessive, the depth of the latter becomes small as a whole. To the contrary, when the exposure time is too short, the concave portion is not formed into a pyramidal shape and it results in a large depth. Further, in the latent images of the areas for curing shown in FIG. 1-1, the lowest part of the nonexposure area of the photopolymerizable composition is subjected to curing by the light of a relatively small amount such as halation or dispersion, where the curing condition is weaker than that of the exposed area. These conditions provide variation in the depth of the images obtainable by the effect of washing time, washing temperature, etc. Thus, the difficulty in providing a fixed depth of the concave portions provides a grave defect to the performance of the printing plate as being less capable of maintaining a stabilized printing quality, since the capacity of the concave portions which should retain the ink is variable on each occasion.

The present invention provides an improved gravure printing plate wherein the depth of the concave portions shall at all times be constant and the defect wherein the depths of the concave portions are variable is eliminated.

According to the present invention, a photopolymer intaglio printing plate is prepared by subjecting a photosensitive plate comprising a support member and a layer of a photopolymerizable composition formed thereon to exposure through a negative or positive film to cure the photopolymerizable composition at the exposed parts of the photosensitive plate, and washing out the photopolymerizable composition at the non-exposed parts of the photosensitive plate down to the bottom of said layer, to make the photopolymer intaglio printing plate having concave portions of a constant depth, said layer having such a thickness that the bottom of each concave portion is in contact with the support material on completion of the washing out of the photopolymerizable composition at the non-exposed portions.

In the photosensitive plate, an adhesive layer or a halation-preventing layer may be optionally provided between the support member and the photopolymerizable layer.

The most characteristic feature of the invention resides in the amount of light for exposure. Namely, the amount of light on exposure is to be not less than an amount which can cure the photopolymerizable composition at the exposed parts down to the bottom of the photopolymerizable layer or the interface between the photopolymerizable layer and the support member (hereinafter referred to as "minimum light amount") and not more than an amount which can leave uncured the photopolymerizable composition at the lowermost portion of the photopolymerizable layer corresponding to the non-exposed part having a minimum area among the non-exposed parts (hereinafter referred to as "maximum light amount"). By the application of such amount of light to the photosensitive plate on exposure, there can be produced a photopolymer intaglio printing plate having concave portions of a constant depth.

To illustrate the present invention in more detail, FIG. 2-1 shows the photosensitive plate at the intermediary stage of exposure and also at the stage where the minimum light amount has been applied. Thus, the incoming light which passes through the exposed part causes curing of the photopolymerizable composition down to the support member.

When the application of light is further continued, the light is reflected at the surface of the support member or, if present, of the adhesive layer and turns and spreads to the lower parts of the non-exposed area, whereby the curing of the photopolymerizable composition at such parts proceeds as shown in FIG. 2-2, which indicates the photosensitive plate at the final stage of exposure and also at the stage where the maximum light amount has been applied. The negative or positive film is separated off from the photosensitive plate at this stage, and the photosensitive plate is washed out to completely eliminate the uncured photopolymerizable composition, whereby a photopolymer intaglio printing plate having concave portions of a constant depth as shown in FIG. 2-3 is obtained. Whenever the exposure is stopped at any stage between the intermediary stage as shown in FIG. 2-1 and the final stage as shown in FIG. 2-2, there is obtainable a photopolymer intaglio printing plate of which the concave portions have a constant depth. From the viewpoints of the quality of the printing plate and the efficiency of the operation, the exposure up to the final stage is favorable. Rather, the thickness of the photopolymerizable layer may be so designed as producing a printing plate of good quality with high efficiency.

The conditions for exposure may be appropriately selected taking into consideration various factors such as the kind of the photopolymerizable composition, the thickness of the photopolymerizable layer, the number of lines present in the negative or positive film to be used, etc. Further, the thickness of the photopolymerizable layer is determined depending on the number of lines present in the negative or positive film to be used. For example, the thickness may be preferably within a range of 5 to $50\mu$ in the case of 150 lines/inch, 5 to $100\mu$ in the case of 85 lines/inch, and 5 to $200\mu$ in the case of 50 lines/inch. Within these ranges, the thickness of the photopolymerizable layer may be determined in consideration of the amount of halation of the support member to be used or in proportion to the depth of the concave portions required.

After completion of the exposure, by developing the non-exposed photopolymerizable layer by a solvent such as water, aqueous alkali, alcohol, etc. and washing out the non-exposed photopolymerizable composition so that the surface of the support member becomes visible or, when an adhesive layer is utilized, to the stage where the surface of the adhesive layer appears, a gravure printing plate having concave portions of a constant depth as shown in FIG. 2-3 is obtainable.

As above, by previously forming on a support member a layer of a photopolymerizable composition which has the same thickness as the required depth of the concave portions and subjecting to exposure, and then washing out the non-exposed portions fully to the stage where the surface of the support member or the surface of the adhesive layer becomes visible, irregularities of the depth of the photopolymer layer dependent on the washing condition can be prevented and the depth of the concave portions can be maintained to a fixed level irrespective of the area thereof.

In order to provide an intaglio halftone gravure of a constant depth, the exposure time may be determined as follows: several photosensitive plates comprising a support member having a certain halation-preventing layer and a layer of a certain photopolymerizable composition having a certain thickness and provided on the said halation-preventing layer are prepared; a halftone positive film is closely contacted on one of the photosensitive plates and subjected to exposure for determination of a minimum exposure time which leaves the wall of the part having a highest density of the halftone positive film, i.e. of the non-transparent or opaque part having a largest area on the halftone positive film; the other photosensitive plates are subjected to exposure with an exposure time as increased every 10 seconds from the minimum exposure time, followed by development; the halftone dots of the resulting plates are observed to find out the exposure time under which the depth of the concave portion having a minimum area is equal to that of the concave portion having a maximum area. The thus determined exposure time is an optimum one. When the thickness of the photopolymerizable layer is changed, then the above procedure is repeated to find out the optimum exposure time.

The washing operation may be made by either spraying the washing liquid over the surface of the photopolymerizable layer after exposure or by lightly rubbing the surface of the above photopolymerizable layer in the washing liquid to the stage where the surface of the support member or the adhesive layer thereof becomes visible.

In conventional intaglio printing plates prepared by etching copper plates or copper-plated surfaces, there is seen a tendency that the area of the wall portion forming the concave cells becomes small in the step of etching. Because of this reason, the area of the flat portion on the intaglio printing plates becomes smaller than the area of the transparent part of the halftone positive film used, and the tone is obliged to become more dark in the resulting printed matter than expected. Accordingly, the range of the steps as can be reproduced by the use of conventional intaglio printing plates is narrow. In the photopolymer intaglio printing plates of the invention, the walls are formed at the stage of photo-curing, and the uncured parts are simply washed out. Thus, the area of the walls is entirely equal to that of the halftone positive film. Accordingly, the intaglio printing plates of the invention have a very broad range of steps as reproducible.

The support member to be used may be either metal or plastic material, and the shape thereof may be either plate shape or cylindrical. When it is a plate-shaped one, the product concave plate can be used for a sheet-fed photogravure press. When it is a cylindrical one, the product concave cylinder can be used for a rotary photogravure press in general use, i.e. for endless continuous printing. The kinds of metal preferred are iron, aluminium and copper, and the preferred kinds of plastics include polyethylene, polypropylene, polyvinyl chloride, polyester, etc. Especially, in case of a cylindrical support member, the use of a metal such as iron, aluminium or copper is preferred from the viewpoint of strength. In using such metal support member, an adhesive agent may be applied thereto for improvement of the adhesion between such member and the photopolymerizable layer. Further, the metal support member may be previously subjected to chemical treatment to assure a strong adhesion between the support member and the photopolymerizable layer. As for such chemical treatment, for example, zinc phosphate treatment is suitable for an iron support member, and chromate treatment is proper for an aluminium support member.

In addition to the improvement of the adhesion, said chemical treatment is effective in eliminating metallic luster, thereby making it possible to prevent the ill effect of excessive halation at the surface of the support member. The presence of excessive halation is most undesirable in order to obtain an intaglio printing plate having an even depth. A suitable amount of halation is that the reflection on irradiation by an ultraviolet ray of 360 mμ is in a range of from 5 to 40%. By means of said chemical treatment, the reflection on the surface of the support member comes within the suitable range.

As for the photopolymerizable composition, either solid type or liquid type having a photocuring property can be used. Especially, in using a support member of cylindrical form, a solid type is desirable. Particularly preferred is a photopolymerizable composition which, in addition to the above characteristics, can be diluted with a suitable solvent to make a solution form. Such photopolymerizable composition is advantageous in view of the process for coating on a cylindrical support member.

Usually, the photopolymerizable composition comprises a polymeric material as a binder, an addition polymerizable, ethylenically unsaturated monomer as a curing component and a photopolymerization initiator which can polymerize said monomer under irradiation. Examples of the polymeric material are partially saponified polyvinyl acetate, polyvinyl alcohol, nitrogen-containing derivatives of polyvinyl alcohol, cellulose derivatives such as alkyl celluloses (e.g. methyl cellulose, ethyl cellulose), hydroxyalkyl alkyl cellulose ethers (e.g. hydroxypropyl methyl cellulose, hydroxyethyl ethyl cellulose), cellulose acetate phthalate and hydroxyalkyl cellulose phthalate, polyamide resins, polyester resins, etc.

The addition polymerizable ethylenically unsaturated monomer may be a non-volatile one having a boiling point not lower than 100° C. such as acrylic acid, methacrylic acid, acrylamide, methacrylamide, diacetone acrylamide, N-t-butylmethacrylamide and N,N'-methylene bismethacrylamide, and salts and esters of acrylic acid and methacrylic acid. As for the salts of acrylic acid and methacrylic acid, there are, for example, metal salts (e.g. calcium, magnesium, zinc, aluminium salts) and ammonium salts. As for the esters of acrylic acid and methacrylic acid, there are exemplified alkyl esters (e.g. methyl, ethyl, n-butyl, isobutyl esters), hydroxyalkyl esters (e.g. β-hydroxyethyl, β-hydroxypropyl esters), monoesters and diesters of polyalkylene glycol, polyvalent esters of polymethylolalkanes (e.g. trimethylolalkanes, tetramethylolalkanes), etc. Among these monomers, particularly preferred are metal salts of acrylic acid or methacrylic acid (e.g. calcium acrylate, calcium methacrylate, magnesium acrylate, magnesium methacrylate, zinc acrylate, zinc methacrylate, aluminium acrylate, aluminium methacrylate). They are usually in a crystalline form at room temperature and soluble in alcohols (e.g. methanol, ethanol), hydrous alcohols, water, acidic water, etc. Their decomposition temperatures are generally higher than about 300° C.

The photopolymerization initiator may be, for instance, benzoin or its alkyl ether (e.g. methyl, ethyl, isopropyl, n-butyl, isobutyl, octyl ether) ω-bromoacetophenone, benzylanthraquinone, etc.

In the photopolymerizable composition, the ethylenically unsaturated monomer may be used in an amount not exceeding 300 parts by weight, preferably of from 5 to 150 parts by weight, to 100 parts by weight of the polymeric material. The photopolymerization initiator may be used in an amount of from 0.1 to 10 parts by weight to 100 parts by weight of the ethylenically unsaturated monomer.

In addition to the said three components, the photopolymerizable composition may include any other additive such as a polymerization inhibitor, an antioxidant (e.g. hydroquinone, p-methoxyphenol, 2,6-di-t-butyl-p-cresol), a filler (e.g. glass, mica, talc, polyethylene, polymethyl methacrylate), a dyestuff or a pigment (e.g. carbon).

The above components are mixed together, if necessary with an appropriate solvent such as water, an alcohol or a ketone, optionally followed by defoaming treatment, to make a photopolymerizable composition.

For preparation of a photosensitive plate, the photopolymerizable composition may be applied onto the surface of a support member, followed by drying so as to evaporate the solvent to make a layer of the photopolymerizable composition having a desired thickness, usually of 5μ or more. The application to the support member may be accomplished, for instance, by any of the following procedures:

(1) The photopolymerizable composition is sprayed onto a cylindrical support member, followed by drying.

(2) A cylindrical support member is dipped in a bath of the photopolymerizable composition while rotating the member so as to transfer the photopolymerizable composition onto the cylindrical support member, followed by drying.

(3) A coating roll is dipped in a bath of the photopolymerizable composition while rotating the roll so as to transfer the photopolymerizable composition onto the coating roll, the coating roll is contacted with a cylindrical support member so as to retransfer the photopolymerizable composition from the coating roll onto the cylindrical support member, followed by drying.

(4) The photopolymerizable composition is poured onto a cylindrical support member in a curtain state through a slit positioned above the cylindrical support member so as to coat the cylindrical support member, followed by drying.

(5) The photopolymerizable composition is extruded onto a cylindrical support member from a nozzle positioned above the cylindrical support member while rotating the cylindrical support member and moving the nozzle parallel to the cylindrical support member, followed by drying.

In any of the above procedures, it is necessary to keep the cylindrical support member rotating at a constant speed during the coating process and the drying process. The photopolymerizable layer thus coated and molded may be used in this state, or the surface of the photopolymerizable layer may be polished or ground to improve the precision of the cylinder.

In order to make a gravure printing plate from the thus obtained photosensitive plate, the photopolymerizable layer and a halftone positive film may be closely contacted by a conventional method such as vacuum contact method and exposed to an ultraviolet ray so as to harden the photopolymerizable composition at the exposed part, after which the halftone positive film is separated, and the photopolymerizable layer is subjected to an adequate washing operation with water, aqueous alkali, alcohol, etc. to wash out the photopolymerizable composition at the non-exposed part. Washing is effected until the surface of the support member or of the adhesive layer is revealed. After completion of the washing, the plate is dried under an ordinary condition to give a desired intaglio halftone gravure printing plate having a constant depth of the concave portions.

Since a composition comprising the said preferred ethylenically unsaturated monomer, particularly the metal salt of acrylic acid or methacrylic acid, together with partially saponified polyvinyl acetate and benzoin isopropyl ether is cured to afford a product which can be hardened to a greater extent by a simple operation of heat treatment, such composition is particularly useful for manufacture of a gravure printing plate.

Practical and presently preferred embodiments of the present invention are illustratively shown in the following examples, wherein part(s) and % are by weight.

EXAMPLE 1

(A) Surface treatment of a support material:

A 0.5 mm thick iron plate is degreased on its surface, after which it is dipped for 3 minutes in a zinc phosphate solution containing phosphate ion, nitrate ion, zinc ion and a promoting agent (prepared by admixing 5 parts of a zinc phosphate treating agent "Glanozin L-723" (trademark, Nippon Paint Co., Ltd.) with 95 parts of water) maintained at 55° C., washed with warm water of 60° C. and dried. This treatment provides the surface of 15% in reflection on irradiation with an ultraviolet ray of 360 mμ.

(B) Preparation of a photopolymer intaglio printing plate:

| Materials | Part(s) |
| --- | --- |
| 50% aqueous solution of partially saponified polyvinyl acetate (saponification degree, 88 mol %; average polymerization degree, 500) | 100 |
| 30% aqueous solution of zinc acrylate | 70 |
| Methanol | 100 |
| Benzoin isopropyl ether | 2 |

The above materials are mixed well by stirring to give a photopolymerizable composition. The photopolymerizable composition is evenly coated on the surface-treated iron plate with a doctor blade and dried in a drying oven of 60° C. for about 10 minutes to form a layer of the photopolymerizable composition having a thickness of 40μ.

The resulting photosensitive plate is brought into close contact with a halftone positive film having a pattern of halftone photography made by separation of a step tablet having different densities of from 0.85 to 2.15 through a gravure contact screen having 65 lines/inc ("MAZENTA GRAVURE POSI", trademark, Dainippon Screen Co., Ltd.) and subjected to exposure with a 3 KW high pressure mercury lamp from a distance of 80 cm for 1½, 1⅔, 1 5/6, 2 or 2 1/6 minutes. Thereafter, the halftone positive film is taken off, and the plate is washed with a water spray of 1 kg/cm² for about 30 seconds to remove completely the photopolymerizable composition at the non-exposed part and then dried in a drying oven at 100° C. for 5 minutes to give a photopolymer intaglio printing plate provided with concave portions. The relationship between the exposure time and the depth of the concave portion on each step is shown in Table 1.

TABLE 1

| Exposure No. | Time (min.) | Step No. 1 | 2 | 3 | 4 | 5 | 6 | 7 | 8 | 9 | 10 |
| --- | --- | --- | --- | --- | --- | --- | --- | --- | --- | --- | --- |
| | | Density | | | | | | | | | |
| | | 0.8 | 0.95 | 1.10 | 1.25 | 1.40 | 1.55 | 1.70 | 1.85 | 2.00 | 2.15 |
| 1 | 1 ½ | 40 | 40 | 40 | 40 | 40 | 40 | 40 | 40 | — | — |
| 2 | 1 ⅔ | 40 | 40 | 40 | 40 | 40 | 40 | 40 | 40 | 40 | 40 |
| 3 | 1 5/6 | 40 | 40 | 40 | 40 | 40 | 40 | 40 | 40 | 40 | 40 |
| 4 | 2 | 35 | 35 | 40 | 40 | 40 | 40 | 40 | 40 | 40 | 40 |

TABLE 1-continued

| Exposure | | Step No. | | | | | | | | | |
|---|---|---|---|---|---|---|---|---|---|---|---|
| | | 1 | 2 | 3 | 4 | 5 | 6 | 7 | 8 | 9 | 10 |
| No. | Time (min.) | Density | | | | | | | | | |
| | | 0.8 | 0.95 | 1.10 | 1.25 | 1.40 | 1.55 | 1.70 | 1.85 | 2.00 | 2.15 |
| 5 | 2 1/6 | 10 | 10 | 20 | 20 | 25 | 35 | 40 | 40 | 40 | 40 |

Note:
—, no wall remained.

From the above table, it is understood that a photopolymer intaglio printing plate with concave portions having a constant depth of 40μ is obtainable by an exposure time of 1⅔ to 1 5/6 minutes.

EXAMPLE 2

(A) Surface treatment of a support material:

The surface of an iron cylinder having a circumference of 40 cm and a width of 45 cm is degreased and treated with the same zinc phosphate solution as in Example 1.

(B) Preparation of a photopolymer intaglio printing plate:

Onto the surface-treated iron cylinder rotating at a speed of 10 r.p.m., the same photopolymerizable composition as in Example 1 is flowed down from a nozzle of 1 mm in diameter fixed at the position 1 cm above the cylinder while moving the nozzle parallel to the cylinder at a velocity of 10 mm/min, whereby the entire surface of the cylinder is coated with the photopolymerizable composition. After completion of the application, the cylinder is kept rotating to dry the photopolymerizable composition coating under a blast of hot air for about 20 minutes to form a layer of the photopolymerizable composition having a thickness of 40μ.

The resulting cylindrical layer of the photopolymerizable composition is wound with the same halftone positive as in Example 1 and, after a slit of 5 cm wide is provided in front of the cylindrical layer, subjected to exposure with a 3 KW high pressure mercury lamp from a distance of 80 cm for 15 minutes. The exposure time corresponds to 1 5/6 minutes in Table 1 of Example 1. Thereafter, the halftone positive film is taken off, and the photopolymerizable layer is washed with water to remove the photopolymerizable composition at the non-exposed part and then dried to give a cylindrical photopolymer intaglio printing plate provided with concave portions having a constant depth of 40μ.

EXAMPLE 3

(A) Surface treatment of a support material:

The surface of a 0.5 mm thick iron plate is degreased and treated with the same zinc phosphate solution as in Example 1.

(B) Preparation of a photopolymer intaglio printing plate:

| Materials | Part(s) |
|---|---|
| 40% aqueous solution of partially saponified polyvinyl acetate (saponification degree, 88 mol %; average polymerization degree, 500) | 100 |
| Zinc acrylate (solid) | 10 |
| β-Hydroxypropyl methacrylate | 40 |
| Benzoin isopropyl ether | 2 |
| Methyl alcohol | 50 |
| Eosine | 0.1 |

The above materials are mixed well by stirring to give a photopolymerizable composition. The photopolymerizable composition is evenly coated on the surface-treated iron plate with a doctor blade and dried at 60° C. for about 30 minutes to form a layer of the photopolymerizable composition having a thickness of 40μ.

The resulting photosensitive plate is brought into close contact with a halftone step tablet of 150 lines/inch having different densities of 0.80 to 1.85 in a vacuum printing mask and exposed to a 3 KW high pressure mercury lamp from a distance of 80 cm for 10, 20, 30 or 40 seconds. Thereafter, the plate is washed with a water spray of 1 kg/cm² for about 2 minutes to remove the photopolymerizable composition at the non-exposed part and then dried in a drying oven at 100° C. for 5 minutes to give a photopolymer intaglio printing plate provided with concave portions. The relationship between the exposure time and the depth of the concave portion on each step is shown in Table 2.

TABLE 2

| | Exposure Time | Step No. | | | | | | | |
|---|---|---|---|---|---|---|---|---|---|
| | | 1 | 2 | 3 | 4 | 5 | 6 | 7 | 8 |
| No. | (sec.) | Density | | | | | | | |
| | | 0.8 | 0.95 | 1.10 | 1.25 | 1.40 | 1.55 | 1.70 | 1.85 |
| 1 | 10 | 40 | 40 | 40 | 40 | 40 | — | — | — |
| 2 | 20 | 40 | 40 | 40 | 40 | 40 | 40 | 40 | 40 |
| 3 | 30 | 20 | 20 | 25 | 35 | 40 | 40 | 40 | 40 |
| 4 | 40 | 10 | 20 | 20 | 20 | 30 | 35 | 40 | 40 |
| Diameter of dot (μ) | | 100 | 110 | 120 | 125 | 130 | 140 | 150 | 150 |

Note:
—no wall remained.

From the above table, it is understood that a photopolymer intaglio printing plate with concave portions having a constant depth of 40μ is obtainable by an exposure time of around 20 seconds.

EXAMPLE 4

(A) Surface treatment of a support material:

The surface of a 0.5 mm thick iron plate is degreased and treated with the same zinc phosphate solution as in Example 1.

(B) Preparation of a photopolymer intaglio printing plate:

The same photopolymerizable composition as in Example 3 is coated on the iron plate to form a layer of the photopolymerizable composition having a thickness of 100μ.

The resulting photosensitive plate is brought into close contact with a halftone positive film of 50 lines- /inch in a vacuum printing mask and exposed to a light for 40 seconds, after which it is subjected to water spraying at a hydraulic pressure of 1 kg/cm² for about 1 minute and dried to give a photopolymer intaglio printing plate provided with concave portions having a constant depth of about 100μ.

EXAMPLE 5

(A) Surface treatment of a support material:

A 0.5 mm thick aluminium plate is degreased on its surface, after which it is dipped for 3 minutes in a chromate solution (prepared by admixing 2 parts of an aluminium film forming agent "Alozine 200" (trademark, Nippon Paint Co., Ltd.) with 100 parts of water) maintained at 40° C., washed with water and dried. This treatment provides the surface of 25% in reflection on irradiation with an ultraviolet ray of 360 mμ.

(B) Preparation of a photopolymer intaglio printing plate:

| Materials | Part(s) |
| --- | --- |
| 40% aqueous solution of partially saponified polyvinyl acetate (saponification degree, 88 mol %; average polymerization degree, 500) | 100 |
| Aluminium acrylate (solid) | 10 |
| β-Hydroxypropyl methacrylate | 40 |
| Benzoin isopropyl ether | 2 |
| Methyl alcohol | 50 |
| Eosine | 0.01 |

The above materials are mixed well by stirring to give a photopolymerizable composition. The photopolymerizable composition is evenly applied onto the surface-treated aluminium plate with a doctor blade and dried to form a layer of photopolymerizable composition having a thickness of 40μ.

The resulting photosensitive plate is brought into close contact with a halftone positive film of 65 lines/inch in a vacuum printing mask and treated in the same manner as in Example 1 to give a photopolymer intaglio printing plate provided with concave portions having a constant depth of about 40μ.

What is claimed is:

1. A process for preparing a photopolymer intaglio printing plate for gravure printing, comprising a metal or plastic support member and a photopolymer layer provided thereon, said layer having concave portions of a constant depth as ink cells and the lowermost part of each of the concave portions reaching to the surface of the support member so that the surface of the support member is exposed to air at least as a point at said lowermost part, which comprises subjecting a photosensitive plate comprising the support member and a layer, 5 to 50 microns thick, of a photopolymerizable composition containing 100 weight parts of a polymeric material as a binder, 5 to 150 weight parts of an addition polymerizable, ethylenically unsaturated monomer having a boiling point of not lower than 100° C., said monomer being a metal salt of acrylic acid or methacrylic acid wherein the metal component is Ca, Mg, Zn or Al, and 0.1 to 10 weight parts, per 100 weight parts of said monomer, of an addition polymerization initiator provided on said support member, to exposure through a halftone negative or positive film to such an extent that the photopolymerizable composition at the exposed parts is cured down to the bottom of the photopolymerizable composition layer, but that the photopolymerizable composition in contact with the support member below the center of the non-exposed part of smallest area among all non-exposed parts remains uncured, and completely washing out the photopolymerizable composition at the non-exposed parts to obtain a plate wherein the bottom of each of said concave portions is in contact with said support member.

2. A photopolymer intaglio printing plate, for gravure printing, having ink cells of constant depth and being capable of producing tone in accordance with the area of the cells at the level of the surface of said plate, which plate is prepared by the process according to claim 1.

3. The process according to claim 1, wherein the support member is a cylinder made of iron, aluminium or copper.

4. The process according to claim 1, wherein the support member is an iron plate or cylinder previously subjected to zinc phosphate treatment.

5. The process according to claim 1, wherein the support member is an aluminium plate or cylinder previously subjected to chromate treatment.

* * * * *